(12) United States Patent
Arnold et al.

(10) Patent No.: US 7,355,414 B2
(45) Date of Patent: Apr. 8, 2008

(54) TEST APPARATUS WITH LOW-REFLECTION SIGNAL DISTRIBUTION

(75) Inventors: Ralf Arnold, Poing (DE); Heinz Mattes, München (DE); Klaus Standner, Villach (AT)

(73) Assignee: Infineon Technologies, AG, Neubiberg (DE)

( * ) Notice: Subject to any disclaimer, the term of this patent is extended or adjusted under 35 U.S.C. 154(b) by 103 days.

(21) Appl. No.: 11/348,525

(22) Filed: Feb. 7, 2006

(65) Prior Publication Data

US 2006/0186896 A1 Aug. 24, 2006

(30) Foreign Application Priority Data

Feb. 7, 2005 (DE) ...................... 10 2005 005 751

(51) Int. Cl.
*G01R 27/04* (2006.01)
(52) U.S. Cl. ...................... 324/629; 324/649
(58) Field of Classification Search ............... 324/765, 324/729, 629, 649
See application file for complete search history.

(56) References Cited

U.S. PATENT DOCUMENTS

| | | | |
|---|---|---|---|
| 6,759,854 B2 | 7/2004 | Logisch | |
| 6,784,674 B2 | 8/2004 | Miller | |
| 2005/0253603 A1* | 11/2005 | Capps et al. | 324/754 |

OTHER PUBLICATIONS

Ching-Wen Hsue; Clock Signal Distribution Network for High Speed Testers, IEEE, AT&T Bell Laboratories, Princeton, New Jersey, 1989 International Test Conference, Paper 8.2, pp. 199-207, no month available.
http//www.andus.de/Leiterplatten/Tabellen/leiterplattenmarerial. htm, 5 pages, Feb. 2, 2005.

* cited by examiner

*Primary Examiner*—Vincent Q. Nguyen
(74) *Attorney, Agent, or Firm*—Edell, Shapiro & Finnan, LLC

(57) ABSTRACT

A test apparatus includes a signal source that generates a radio-frequency test signal and is connected to the input connection of an arrangement. The arrangement simultaneously supplies an electrical radio-frequency signal to a plurality of receivers and via a plurality of distribution lines. Each distribution line includes an end with an output connection that applies the power-matched test signal to a respective external component.

24 Claims, 3 Drawing Sheets

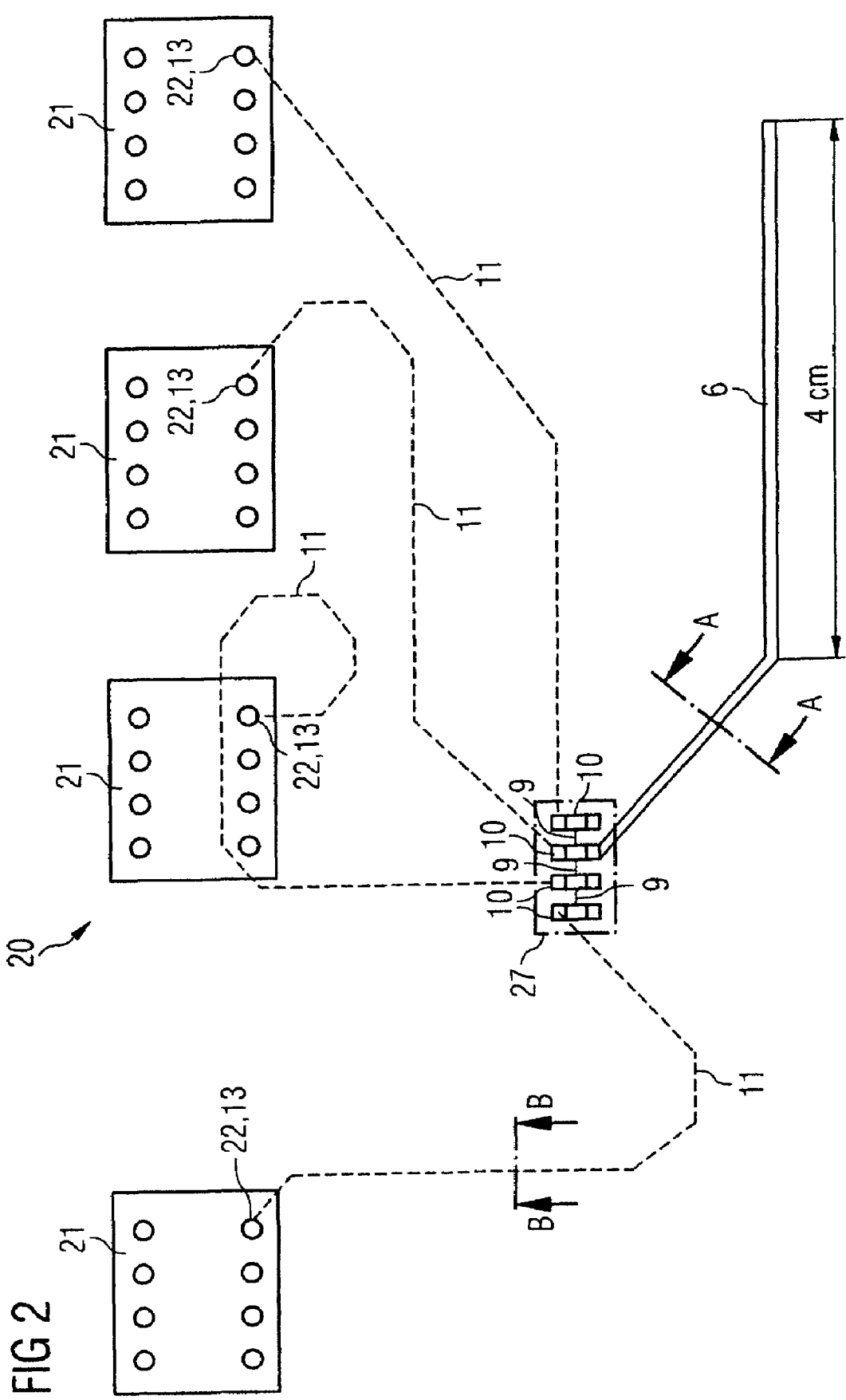

FIG 3 Section A-A
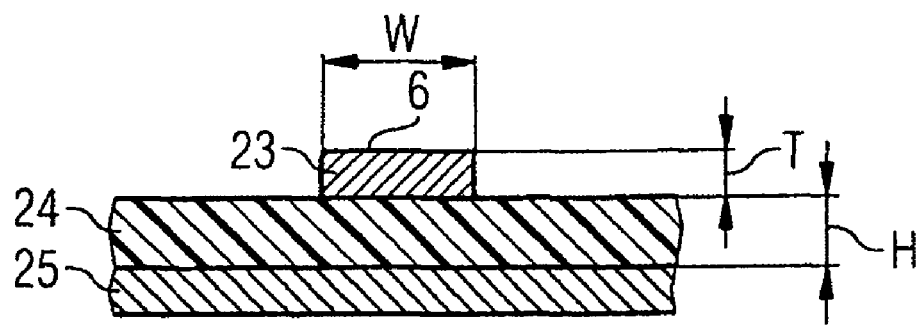
FIG 4 Section B-B
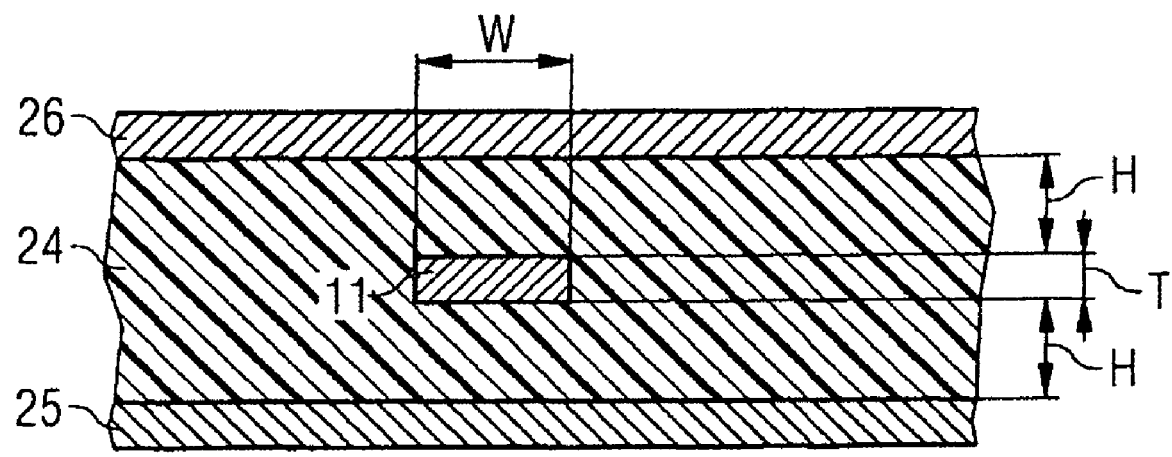

TEST APPARATUS WITH LOW-REFLECTION SIGNAL DISTRIBUTION

CROSS REFERENCE TO RELATED APPLICATIONS

This application claims priority under 35 U.S.C. §119 to German Application No. DE 10 2005 005 751.9, filed on Feb. 7, 2005, and titled "Test Apparatus with Low-Reflection Signal Distribution," the entire contents of which are hereby incorporated by reference.

FIELD OF THE INVENTION

The present invention relates to a test apparatus having a signal source for generating a radio-frequency test signal that is simultaneously provided at a plurality of output connections.

BACKGROUND

Test apparatus that have signal sources that generate radio-frequency test signals are frequently used for testing integrated semiconductor circuits. For example, a test apparatus of this type is described in "*Clock Signal Distribution Network for High Speed Testers*" (documentation for International Test Conference 1989, Paper 8.2, page 199, Ching-Van HSUE).

A test apparatus is described in U.S. Patent Application Publication No. 2003/0210067, where the test apparatus applies four virtually identical test signals on four output connections to four integrated circuits simultaneously. If the result of the procedure disclosed therein is reconstructed in practice, it turns out that the test signals at the output now have only low quality. The reason for this is that a radio-frequency square-wave signal then becomes a sawtooth signal at each of the output connections.

SUMMARY OF THE INVENTION

The present invention provides an arrangement for supplying an electrical radio-frequency signal to a plurality of receivers and also a test apparatus designed therewith which also provides a high-quality radio-frequency square-wave signal at four output connections simultaneously in phase.

In accordance with the present invention, an arrangement comprises a supply line with an end that has a branch point from which a total of N distribution lines extend. A respective ohm resistive resistance or resistor R is provided between each distribution line and the branch point. The arrangement is configured such that the resistance value of the resistors R is respectively of essentially the same magnitude as the value of the distribution line characteristic impedances $Z_{WN}$. In addition, the sum of the resistance values of the resistors R and the distribution line characteristic impedance $Z_{WN}$ is essentially equal to the product of the number N of distribution lines and the value of the supply line characteristic impedance ZW.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 2 schematically depicts a test apparatus implementing the arrangement from FIG. 1 in accordance with the present invention.

FIG. 3 depicts a cross-sectional side view through a supply line taken along lines A-A of FIG. 2.

FIG. 4 depicts a cross-sectional side view through a distribution line taken along lines B-B of FIG. 2.

DETAILED DESCRIPTION

Figure 1:
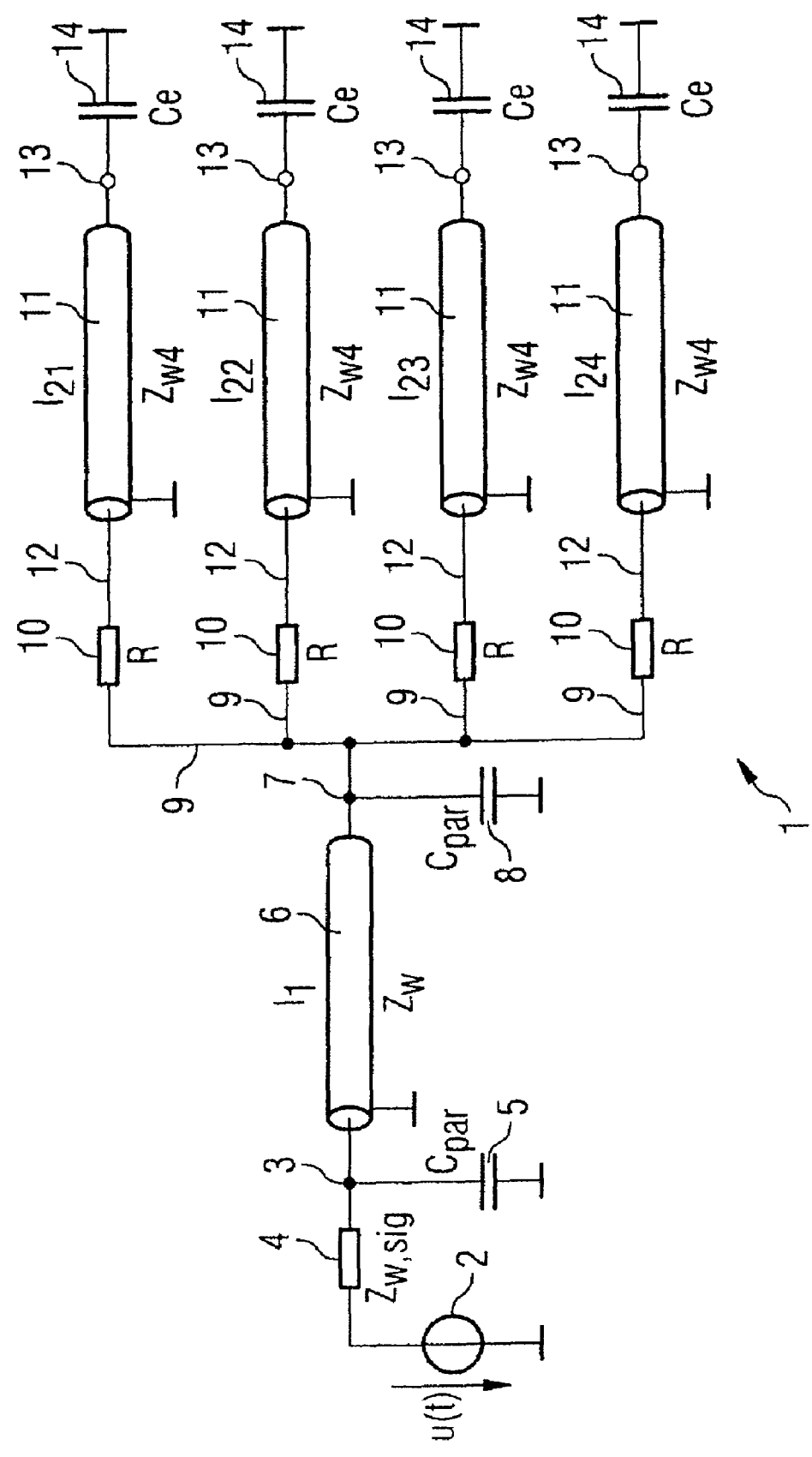
FIG. 1 schematically depicts an arrangement for supplying an electrical radio-frequency signal to a plurality of receivers in accordance with the present invention.

An arrangement is provided in accordance with the invention that includes a supply line with an end that has a branch point from which a total of N distribution lines extend. A respective ohm resistive resistance element or resistor R is provided between each distribution line and the branch point. The arrangement is configured such that the value of the resistors R is respectively of essentially the same magnitude as the value of the distribution line characteristic impedances $Z_{WN}$. In addition, the sum of the values of the resistors R and the distribution line characteristic impedance $Z_{WN}$ is essentially equal to the product of the number N of distribution lines and the value of the supply line characteristic impedance ZW In the arrangement of the invention, the branch point is designed to be reflection-free. In addition, reflections are reduced or prevented entirely at the junctions between the resistors R and the distribution lines. This prevents signal disturbances.

The reason for this is that, if the resistance value R of the ohm resistive series resistance is chosen to be equal to the characteristic impedance $Z_{WN}$ of the relevant distribution line or branch line, then the reflection factor r at the transition points between the ohm resistive resistances and the distribution lines is equal to 0.

Hence, a resistance value R satisfying the following relationship is chosen:

$$r=(R-Z_{WN})/(R+Z_{WN})=0$$

The resistance value chosen in this manner maximizes the transmission bandwidth of the distribution network with reflection-free matching of the transition points between the ohm resistive resistances and the distribution lines.

Unlike in the prior art, the resistance R is not in any way chosen on a random basis, so that the outputs of the distribution lines are decoupled from one another. Rather, careful consideration is used to select a particular value which ensures reflection-free matching of the transition points between the ohm resistive resistances and the distribution lines.

In one embodiment of the invention, the parasitic capacitance at the distribution node becomes less than 100 fF (femtofarrads)-100 pF (picofarrads), and in practice 0.5 pF-60 pF are very easy to achieve; the smaller the better. Hence, attention is paid from the outset to the fact that only a small parasitic capacitance is present at the branch point or at the solder spots for the resistors R. The transmission bandwidth of the arrangement is improved in this way. This can be achieved by using very small physical sizes for the resistor R, for example of the type 08505 SMD or of the type 0402 SMD (1% tolerance, 63, mW). The capacitance at the branch point is obtained as the sum of the capacitance of the solder areas for the resistors and the capacitance of all the distribution lines.

In one advantageous embodiment, the branch point, the distribution lines and the ohm resistive resistances are provided on a common printed circuit board, additionally together with the input connection and the supply line. In this arrangement, the distribution lines are at least partly in the form of metal conductor tracks on the insulating printed circuit board. In addition, the supply line and the input connection may also be provided on the printed circuit board. Such printed circuit boards are popular for testing integrated semiconductor components, in which case holding sockets for the semiconductor components themselves are additionally provided on the printed circuit board. Producing the distribution lines as metal conductor tracks on the printed circuit board means that the lengths of the distribution lines may be made such that equal signal propagation times arise on all the distribution lines.

It is particularly advantageous for the printed circuit board material, at least in the region of the distribution lines, to have a dielectric constant $\epsilon_r$ of less than 4.7, and particularly of less than 3 or 2. Especially when there are numerous lines, as are required for feeding a very large number of signal points simultaneously, characteristic impedances in the region of 200 Ω per distribution line need to be achieved if the characteristic impedance of the total line is intended to be 50 Ω. This can be achieved only with difficulty using conventional printed circuit board material, because the variation in values of a printed circuit board layer with a typical thickness (e.g., one that is achieved with a feasible level of technical effort and where $\epsilon_r$ is in the range from approximately 2 to 5.5) results in typical impedances of 120 Ω. When $\epsilon_r$ is even smaller, larger variations are permitted in the design of the impedances of the waveguides. It may thus be particularly advantageous to choose $\epsilon_r$ to be less than 2 or less than 1.5.

In accordance with the present invention, a different material or a different geometrical dimension is provided for the printed circuit board material at least in the region of the connecting lines, which means that higher impedances in the range from 100 Ω to 200 Ω or even 400 Ω can also be achieved. In addition, the present invention naturally ensures that a compatible material is used with regard to thermal expansion.

When using materials with a relatively small dielectric constant $\epsilon_r$, it is frequently possible to dispense even with a series resistor R. This reduces the damping of the inventive arrangement.

The present invention is useful not only for the wafer test but also for the chip test. In addition, it is also possible to provide more than a total of four distribution lines. The limitations of the prior art are at any rate no longer present with the invention.

The transmission bandwidth of the distribution network of the invention can be improved by specifically reducing a parasitic capacitance at the branch point. This can be achieved, for example, by virtue of a metal ground layer connected to ground potential being omitted at least in the region of the distribution lines and possibly in the region of the supply line, with the ground layer particularly in the region of the branch point having a two-dimensional cutout. This can also be done particularly advantageously in the region of the points at which the series-connected ohm resistive resistances R are mounted, particularly when they are resistors which have been fit on the printed circuit board using SMD technology. In this case, the solder spots for the resistors R are in a form such that there is no longer any ground layer beneath the solder spots.

It is also possible to reduce the geometrical dimensions of the ohm resistive resistances. A smaller physical form reduces the capacitance of the soldering probe. An SMD resistor 0805 package has a pad capacitance of approximately 60 pF, and an SMD 0402 has a pad capacitance of approximately 15 pF when a ground layer is used. If the ground layer is omitted, the pad capacitance of an SMD 0402 is reduced from 15 pF to approximately 80 fF. This increases the cutoff frequency of the low-pass filter comprising the ohm resistive resistances R and the parasitic capacitances in the region of the branch point or the input connection. This also allows the invention to be applied such that there is no optimum matching of the characteristic impedances, and results in signal distortions that can be acceptable.

The parasitic capacitance at the branch point is obtained essentially as the sum of the pad capacitances of the SMD resistors and the capacitances of the distribution lines. With pad capacitances of approximately 80 fF and distribution capacitances of about 30 fF to about 50 fF each, a parasitic capacitance of about 0.5 pF is obtained.

For radio-frequency signals in the region of several 100 kHz and even more so at much higher frequencies, the connecting lines of the distribution networks for the test signals need to be handled as "waveguides". Such waveguides are theoretically explained in detail, for example, in *Meinke/Gundlach, Taschenbuch der Hochfrequenztechnik* (Springer-Verlag). In an equivalent circuit diagram, waveguides can be regarded as a homogeneous line shown as a four-terminal network. In this context, a fundamental part is played by the ohm resistive resistance of the two conductors in the homogeneous line, the DC conductance or the reciprocal of the ohm resistive resistance of the dielectric between the two conductors, the inductance of the two conductors and the capacitance between the two conductors. Reference is respectively made to per-unit resistances, conductances, inductances and capacitances. These four per-unit values for the homogeneous line are used to calculate the characteristic impedance which is important in practice. This contains an active component in the form of the ohm resistive resistance of the two conductors and the DC conductance of the dielectric, and a reactive component in the form of the inductance of the two conductors and the capacitance between the two conductors. In practice, the characteristic impedance is denoted by the formula letter "Z", which is otherwise used to denote impedances or for "complex resistances". In practice, the reactive component plays no significant role.

In the case of a conductor track (e.g., on a board), the dimensions, the distances and the dielectric constant of the insulating material used between the two conductors of the waveguide essentially determine the above-described characteristic impedance of the waveguide.

The characteristic impedance of a waveguide is independent of the length of the line, because all per-unit values are proportional to line length. At low frequencies, the inductance of the two conductors and the capacitance between the two conductors are negligible. At high frequencies, the ohm resistive resistance of the two conductors and the DC conductance of the dielectric are again negligible. At mid-level frequencies, only the DC conductance of the dielectric is negligible. This respectively comes from the relationship between the aforementioned per-unit values of the characteristic impedance and the characteristic impedance itself. In practice, it is true that the "nominal characteristic impedance" can be used without producing significant error, at any rate for signal frequencies between approximately 150 kHz and several GHz.

In practice, the curve of the phase angle is occasionally considered, because whenever the phase angle is 0 the reactive component of the characteristic impedance is negligible. This is the case for very low and very high frequencies, and the line current and the line voltage are then in phase. The characteristic impedance can then be regarded as purely ohm resistive as a simplification. Nevertheless, it must not be imagined to be an ordinary ohm resistive resistance, because ideally it cannot transform electrical power into heat.

Nevertheless, waveguides are subject to damping in practice, namely longitudinal damping as a result of ohmic loss in the conductor material and transverse damping as a result of the transverse leakage losses through the dielectric between the two conductors. In addition, a loss may arise through emitted radiation if the conductor spacing is greater than approximately 1% of the wavelength of the transported radio frequency.

Without special measures, the branch points in a distribution network produce reflections which result in a disturbance to the signal. Such reflections should be avoided as far as possible when integrated circuits are being supplied with test signals.

In addition, significant efforts have also been made to "match" the components of a test apparatus to an integrated circuit which is to be tested. A distinction is drawn here between voltage matching, which is significant particularly when tapping off measurement signals in metrology, current matching, noise matching, which is characterized by a maximum signal-to-noise ratio, and power matching, where maximum and equal power occurs both in the load resistance of a test apparatus and in the internal resistance of the signal source. If the load resistance is too small, this is called undermatching, and if the load resistance is too large, it is called overmatching. The extreme states of this mismatch are current and voltage matching.

FIG. 1 shows a schematic illustration of a signal supply arrangement 1 in accordance with the present invention. The signal supply arrangement 1 includes a signal source 2 for producing a radio-frequency test signal. One pole of the signal source 2 is connected to ground in this arrangement, while the other pole of the signal source 2 is connected to an input connection 3. A characteristic impedance symbol 4 clarifies the complex characteristic impedance $Z_{WSig}$ of the signal source 2. A capacitor symbol 5 illustrates the parasitic input capacitance $C_{par}$ of the input connection 3. The input connection 3 is connected to a supply line 6, shown in FIG. 1 as a coaxial cable with shielding that is grounded and is shown with a supply line characteristic impedance $Z_W$. The supply line 6 ends at a branch point 7, which has a parasitic capacitance $C_{par}$ that is illustrated by a capacitor symbol 8. Short spur lines 9 connect the branch point 7 to ohm resistive resistance elements or resistors 10. The respective other side of each of the resistors 10 is connected to a distribution line 11, specifically at a respective transition point 12. The distribution lines 11 are again shown as a coaxial cable with shielding that is grounded.

Provided at the output of each distribution line 11 is a respective connecting node 13 at which the test signal produced by the signal source 2 can be picked off. As shown in FIG. 1, instead of a circuit to which signals are to be applied an equivalent capacitance $C_e$ is shown, illustrated by a capacitor symbol 14.

The values of the individual components of the signal supply arrangement 1 are selected such that each of the resistors 10 has a resistance value that is of essentially the same magnitude as the characteristic impedance $Z_{W4}$. In addition, the sum of the resistance value of the resistor 10 and of the characteristic impedance $Z_{W4}$ of the supply line 11 is equal to four times the characteristic impedance $Z_W$ of the supply line 6. In this embodiment, power matching is provided, which means that the characteristic impedance of the internal resistance 4 of the signal source 2 is equal to the characteristic impedance $Z_W$ of the supply line 6.

In a variant which is not shown here, the resistors 10 are omitted. As a result, the distribution impedance 11 is as large as four times the supply line impedance 6. This results in a high bandwidth.

FIG. 2 shows a test circuit 20 which is produced on a printed circuit board material (not shown in this view) with a high dielectric constant $\epsilon_r$. Identical components have the same reference numerals. In this case, the material of the printed circuit board is the known "FR4 High TG", with $\epsilon_r$=4.4.

Beyond the supply line 6, the spur lines 9, the ohm resistive resistance elements 10 and the distribution lines 11, the test arrangement 20 also has a total of four test sockets 21. Each test socket 21 includes eight connections, including an input connection 22 in the bottom right-hand corner. A respective distribution line 11 extends from one end of a resistor 10 to a respective input connection 22. The length of the distribution lines 11 in this arrangement is selected such that the distribution lines are of equal length, which means that corresponding signal propagation times arise on each distribution line 11. FIGS. 3 and 4 show a cross section through the supply line 6 and distribution lines 11. As can be seen particularly well in FIG. 3, the supply line 6 is in the form of a rectangular metal conductor track 23 on a printed circuit board material 24. Below the printed circuit board material 24, a continuous ground layer 25 is provided as a metal layer. It is noted that the distribution lines 11 can also have the configuration as shown in FIG. 3.

FIG. 4 shows a cross section through the distribution line 11. As can be seen particularly well in FIG. 4, the distribution line 11 is embedded or buried as an essentially rectangular metal conductor track in the printed circuit board material 24. An additional ground layer 26 is provided on the top of the printed circuit board material 24. It is noted that the supply line 6 can also have the configuration as shown in FIG. 4.

In a region 27 around the resistors 10, which can best be seen in FIG. 2, both the ground layer 26 and the ground layer 25 have cutouts in order to reduce a parasitic capacitance between the spur lines 9 at the input region of the resistors 10 and also the capacitance of the solder areas of the resistors 10. The resistors 10 themselves are in a particularly small form as SMD components, which likewise helps to reduce their parasitic capacitance.

The dimensions of the overall inventive test arrangement 20 can be comprehended approximately when considering that the section of the supply line 6 which is shown in FIG. 2 can have a length of approximately 4 cm.

The common dimensions for the supply line 6 and the distribution line 11 in respect of the geometrical configuration in FIGS. 3 and 4 are obtained as follows.

The form in FIG. 3 results in a characteristic impedance of approximately 50 Ω, if the width W is approximately 3.200 mm. This is based on the fact that the height T of the conductor track 23 is equal to 0.018 mm, while the height H as the thickness of the printed circuit board material 24 is equal to 1.270 mm. With a width W of 0.076 mm, a characteristic impedance for the conductor track 23 of 200 Ω is obtained. The latter form is preferred when the configuration shown in FIG. 3 is provided for a distribution line 11.

If the open configuration shown in FIG. 3 is to be used as a "microstrip" for a supply line 6, then it is naturally necessary to use that embodiment which gives a characteristic impedance of 50 Ω.

The situation is similar for the buried "stripline" shown in FIG. 4. In the application shown in FIG. 2, the thickness T of the supply line 6 is equal to 0.018 mm. The height H of the printed circuit board material above and below the distribution line 11 is 4.318 mm. For a characteristic impedance of 50 Ω, the width W of the distribution line 11 is equal to 5.842 mm.

In another possible form, namely the use as a distribution line 11 shown in FIG. 2, a characteristic impedance of 200 Ω is achieved by virtue of the width W being produced as 0.076 mm.

In a tabular summary, the relationship between the characteristic impedance of a "stripline" (open design) or "microstrip" (buried design) and its geometrical dimensions is as follows, specifically based on the materials "Speedboard C" ($\epsilon_r=2.6$) and "FR4 high TG" ($\epsilon_r=4.4$):

|  | Microstrip | Stripline | Microstrip | Stripline |
|---|---|---|---|---|
| (50 Ω) | 3.2 mm | 5.842 mm | 0.422 mm | 0.660 mm |
| (100 Ω) | possible | possible | 0.097 mm | 0.089 mm |
| (200 Ω) | 0.076 mm | 0.076 mm | currently not appropriate with this material | currently not appropriate with this material |
| T | 0.018 mm | 0.018 mm | 0.018 mm | 0.018 mm |
| H | 1.270 mm | 4.318 mm | 0.216 mm | 1.524 mm |
| $\epsilon_r$ | 2.6 | 2.6 | 4.4 | 4.4 |
| Material | Speedboard C | | "FR4 high TG" | |

The tabulated data is provided for exemplary purposes only, and the invention is in no way limited by this data. The dimensions can be adapted in accordance with the present invention when a material is used with a $\epsilon_r$ that is different, preferably less than 2.6.

With a distribution over four distribution lines, it is possible to dispense with the resistors 10 if $Z_{W4}$ are made equal to 200 Ω. With a distribution of 1:8, the resistors 10 and also $Z_{w8}$ can respectively be stipulated as 200 Ω in order to achieve optimum matching.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An arrangement for supplying an electrical radio-frequency signal to a plurality of receivers, the arrangement comprising:
   a supply line configured to connect to a signal source, wherein the signal source has an internal impedance and the supply line has a supply line characteristic impedance;
   an input connection provided at one end of the supply line to facilitate the connection between the supply line and the signal source;
   a branch point provided at another end of the supply line, the branch point having a parasitic capacitance that is less than 120 pF; and
   a plurality of N distribution lines extending from the branch point, wherein each distribution line has a distribution line characteristic impedance, wherein N is at least 3 and the distribution line characteristic impedance of each of the N distribution lines is essentially equal to the product of N times the supply line characteristic impedance.

2. The arrangement of claim 1, wherein the parasitic capacitance of the branch point is less than 10 pF.

3. The arrangement of claim 2, wherein the parasitic capacitance of the branch point is less than about 0.5 pF.

4. The arrangement of claim 1, wherein at least one of the branch point, the distribution lines and the supply line is provided on a printed circuit board, and at least one of the supply line and the distribution lines is formed from metal conductor tracks disposed on or in the printed circuit board.

5. The arrangement of claim 4, wherein the printed circuit board material has a dielectric constant, at least in the region of the distribution lines, of less than 6.

6. The arrangement of claim 5, wherein the dielectric constant is less than 4.7.

7. The arrangement of claim 6, wherein the dielectric constant is less than 2.6.

8. The arrangement of claim 4, wherein the printed circuit board includes at least one ground metal layer disposed at the branch point and the distribution lines, the at least one ground metal layer being connected to a ground potential and having a cut-out section in the region of the branch point.

9. The arrangement of claim 8, wherein the at least one ground metal layer is further disposed at the supply line.

10. A testing apparatus comprising a signal source that generates a radio-frequency test signal and the arrangement of claim 1, wherein the signal source is connected to the input connection of the arrangement, and each of the distribution lines of the arrangement is provided with a respective output connection that provides a test signal for application to a respective external component.

11. The test apparatus of claim 10, wherein each of the distribution lines has the same length.

12. An arrangement for supplying an electrical radio-frequency signal to a plurality of receivers, the arrangement comprising:
   a supply line configured to connect to a signal source, wherein the signal source has an internal impedance and the supply line has a supply line characteristic impedance;
   an input connection provided at one end of the supply line to facilitate the connection between the supply line and the signal source;
   a branch point provided at another end of the supply line;
   a plurality of N distribution lines extending from the branch point, wherein each distribution line has a distribution line characteristic impedance, wherein N is at least 3 and the distribution line characteristic impedance of each of the distribution lines is essentially equal to the product of N times the supply line characteristic impedance; and
   a printed circuit board including at least one of the branch point, the distribution lines and the supply line, wherein at least one of the supply line and the distribution lines is formed from metal conductor tracks disposed on or in the printed circuit board, and the printed circuit board material has a dielectric constant, at least in the region of the distribution lines, of less than 6.

13. An arrangement for supplying an electrical radio-frequency signal to a plurality of receivers, the arrangement comprising:
   a supply line configured to connect to a signal source having an internal impedance, wherein the supply line has a supply line characteristic impedance;
   an input connection provided at one end of the supply line to facilitate the connection between the supply line and the signal source;

a branch point provided at another end of the supply line;

a plurality of N distribution lines extending from the branch point, wherein each distribution line has a distribution line characteristic impedance; and a plurality of resistors, wherein each resistor is provided between the branch point and a corresponding distribution line, the resistance value of each resistor is essentially as large as the distribution line characteristic impedance of the corresponding distribution line, and the sum of the resistance value of the resistor and the distribution line characteristic impedance of each of the N distribution lines is essentially equal to the product of N times the supply line characteristic impedance.

14. The arrangement of claim 13, wherein the resistors are of an SMD type.

15. A testing apparatus comprising a signal source that generates a radio-frequency test signal and the arrangement of claim 13, wherein the signal source is connected to the input connection of the arrangement, and each of the distribution lines of the arrangement is provided with a respective output connection that provides a test signal for application to a respective external component.

16. The test apparatus of claim 15, wherein each of the distribution lines has the same length.

17. The arrangement of claim 13, wherein the branch point has a parasitic capacitance that is less than 120 pF.

18. The arrangement of claim 17, wherein the parasitic capacitance of the branch point is less than 10 pF.

19. The arrangement of claim 18, wherein the parasitic capacitance of the branch point is less than about 0.5 pF.

20. The arrangement of claim 13, wherein at least one of the branch point, the distribution lines and the supply line is provided on a printed circuit board, and at least one of the supply line and the distribution lines is formed from metal conductor tracks disposed on or in the printed circuit board.

21. The arrangement of claim 20, wherein the printed circuit board material has a dielectric constant, at least in the region of the distribution lines, of less than 6.

22. The arrangement of claim 21, wherein the dielectric constant is less than 4.7.

23. The arrangement of claim 21, wherein the dielectric constant is less than 2.6.

24. The arrangement of claim 20, wherein the printed circuit board includes at least one ground metal layer disposed at the branch point and the distribution lines, the at least one ground metal layer being connected to a ground potential and having a cut-out section in the region of the branch point.

* * * * *